United States Patent [19]

Schweitzer, Jr.

[11] 4,414,543
[45] Nov. 8, 1983

[54] GROUND FAULT INDICATOR

[76] Inventor: Edmund O. Schweitzer, Jr., 1002 Dundee Rd., Northbrook, Ill. 60118

[21] Appl. No.: 190,498

[22] Filed: Sep. 25, 1980

[51] Int. Cl.³ .......................................... G08B 21/00
[52] U.S. Cl. .................................. 340/651; 324/127; 324/133; 336/174; 336/223; 340/664; 335/204
[58] Field of Search ................ 340/650, 651, 664; 324/127, 133; 336/223, 231, 225, 174; 335/204

[56] References Cited

U.S. PATENT DOCUMENTS

| | | | |
|---|---|---|---|
| 1,735,092 | 11/1929 | Roller | 336/174 |
| 3,392,326 | 7/1968 | Lamberton | 336/174 X |
| 3,708,724 | 1/1973 | Schweitzer, Jr. | 340/664 X |
| 3,771,049 | 11/1973 | Piccione | 324/127 X |
| 3,876,911 | 4/1975 | Schweitzer | 340/664 X |
| 3,978,400 | 8/1976 | Pettit | 340/650 X |
| 4,126,857 | 11/1978 | Lancia et al. | 340/620 |

Primary Examiner—John W. Caldwell, Sr.
Assistant Examiner—Daniel Myer
Attorney, Agent, or Firm—Lockwood, Dewey, Alex & Cummings

[57] ABSTRACT

A ground fault indicator for a multi-phase power distribution system includes a split-core magnetic pole assembly having a gap within which is developed a magnetic flux representative of the vector sum of the currents in the individual phase conductors of the system. A magnetic reed switch positioned within the gap responds to the summation current in the gap to trip an indicating circuit in a remotely mounted indicating module in the event of a ground fault.

15 Claims, 12 Drawing Figures

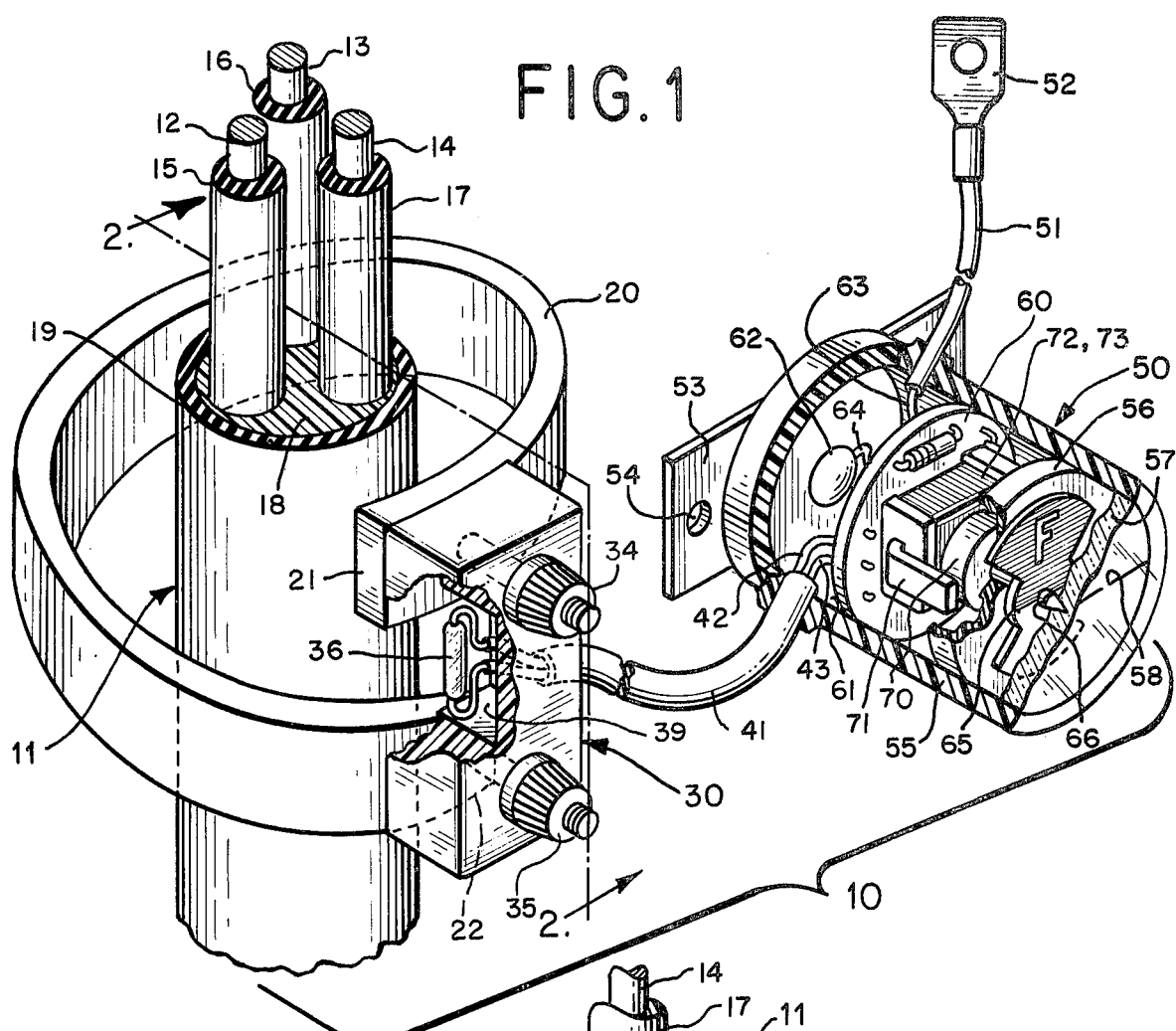
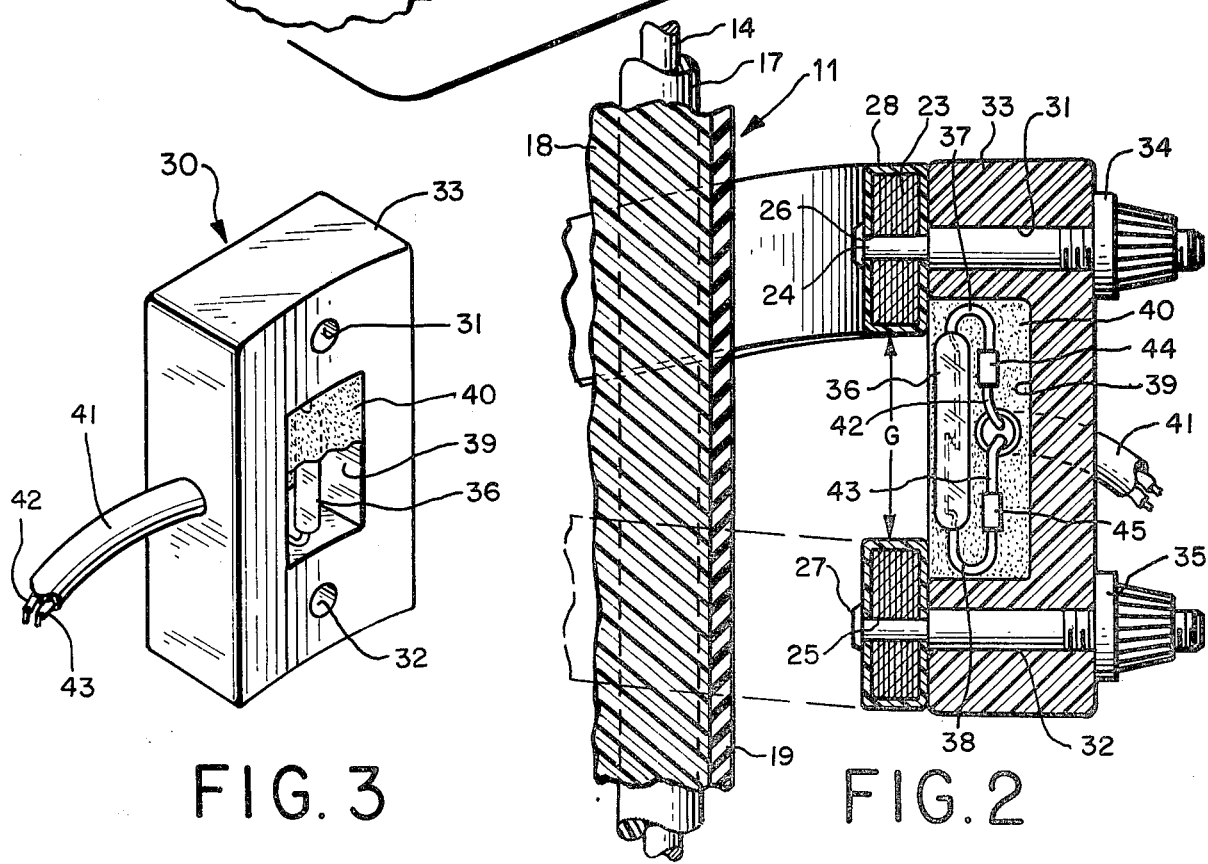
FIG. 1
FIG. 3
FIG. 2

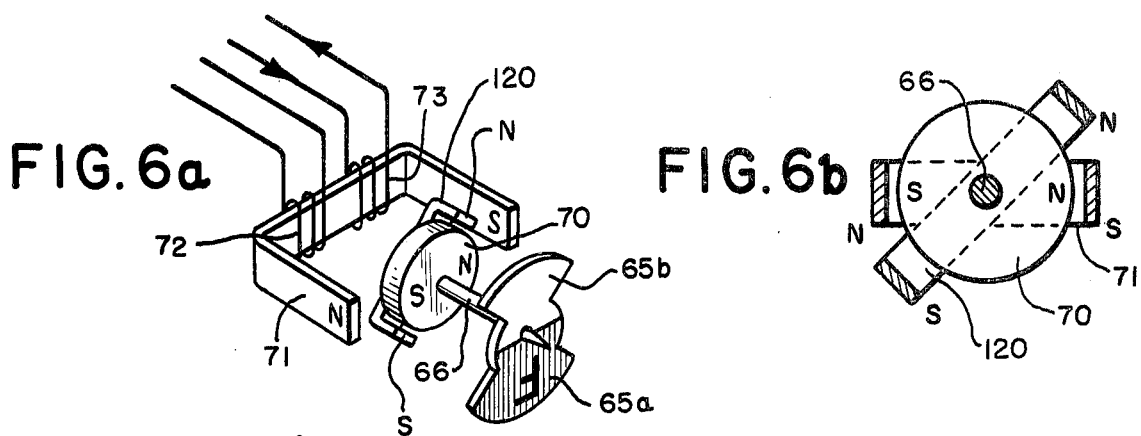
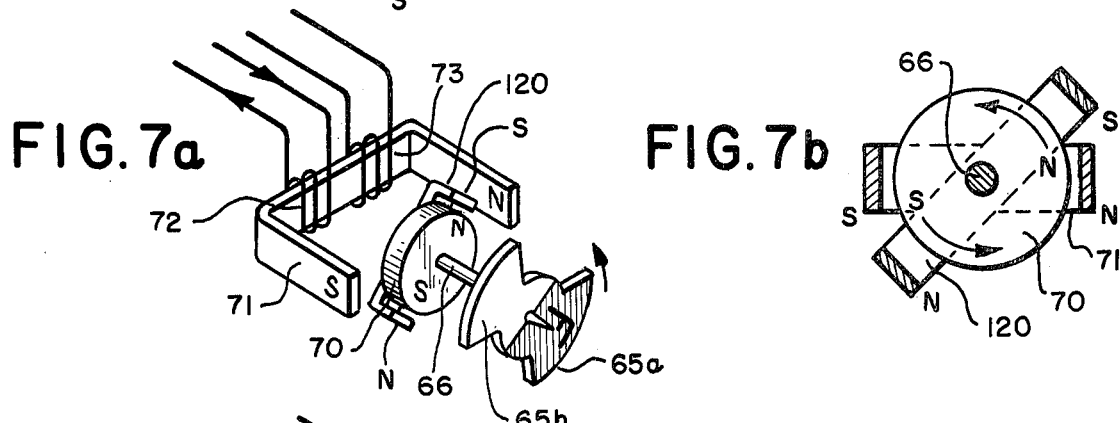
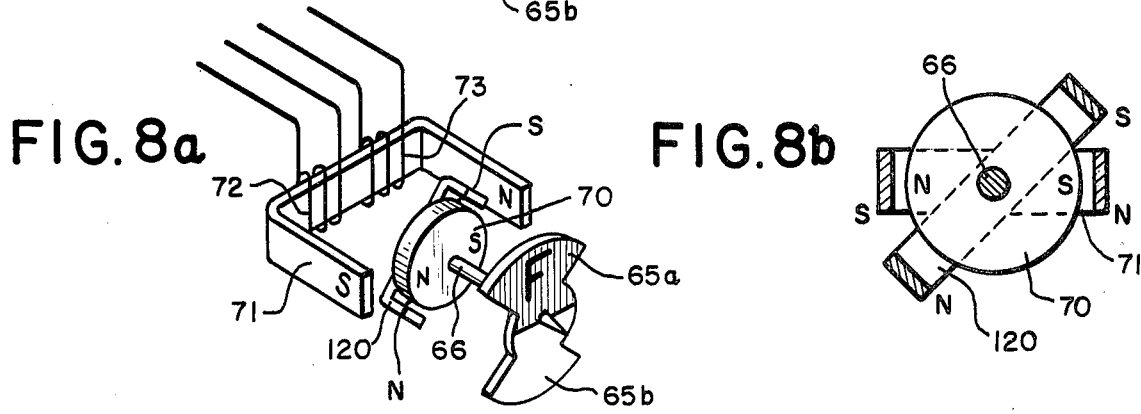
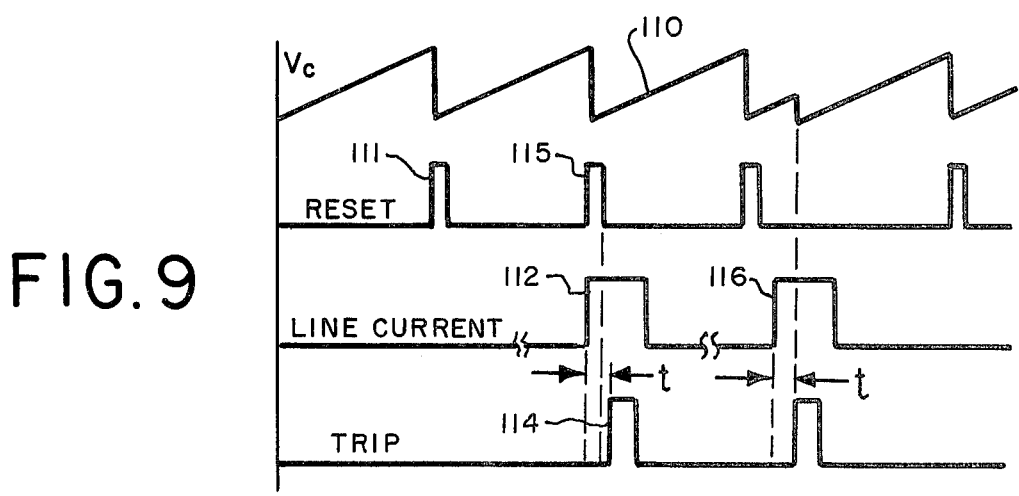

GROUND FAULT INDICATOR

BACKGROUND OF THE INVENTION

The present application relates generally to current sensing devices for electrical systems, and more particularly to fault indicators for detecting ground fault currents in alternating current power distribution systems.

Various types of fault indicators have been constructed for detecting fault currents in individual conductors of alternating current power distribution systems, including clamp-on type fault indicators, which clamp directly over cables in the system, and test-point type fault indicators, which are mounted over test points in the cables or associated connectors of the system. Such fault indicators may be either of the manually reset type, wherein it is necessary that the indicator be physically reset following each fault, or of the automatically reset type, wherein a fault indicator is reset upon restoration of line current. Examples of such fault indicators are found in products manufactured by E. O. Schweitzer Manufacturing Company of Mundelein, Illinois, and described in U.S. Pat. Nos. 3,676,740, 3,906,477 and 4,063,171, of the present inventor.

It is sometimes necessary that multi-phase mains in power distribution systems be monitored for ground faults, wherein current flows from a load directly to ground and does not return through the individual neutral or phase conductors of the system. Fault indicators such as those described above, which respond to fault currents in a single monitored conductor, are not suitable for the purpose of detecting ground fault currents, which may be lower than the normal current in any one phase conductor.

One approach at detecting ground faults in multi-phase mains has been to lead the individual phase conductors, and the neutral conductor, where present, through a toroidal summation current transformer on which a secondary sense winding is provided. In the absence of a ground fault the vector sum of all currents in the phase conductors extending through the summation current transformer is zero, and no current is induced in the sense winding. In the event of a ground fault, the sum of the currents flowing through the transformer is no longer equal to zero, and a current is induced in the sense winding. This current is amplified and processed in amplification and processing circuitry to produce an output signal indicative of the occurrence of a ground fault.

Unfortunately, the sense winding and associated amplification and processing circuitry add to the cost and complexity of such toroidal core ground fault indicators, making the indicators unsuitable for many applications, particularly those at remote locations where environmental and cost considerations dictate a small easily interpreted self-contained unit operable from available power sources of relatively high voltage. Furthermore, the toroidal core is difficult to install on existing multi-phase mains, since the individual phase conductors must be disconnected to enable the mains cable to be routed through the closed toroidal core.

The present invention is directed to a new and improved ground fault indicator which does not require a toroidal core having a sense winding, and which is operable from existing voltage sources in a power distribution system.

Accordingly, it is a general object of the present invention to provide a new and improved ground fault indicator.

It is a more specific object of the present invention to provide a ground fault indicator which is compact and economical to construct and which does not require a toroidal core having a sense winding.

It is a still more specific object of the present invention to provide a ground fault indicator which can be readily installed and removed from a multi-phase mains cable of a power distribution system.

SUMMARY OF THE INVENTION

The invention is directed to a fault indicator for indicating the occurrence of a ground fault in multi-phase mains cable of a power distribution system. The indicator includes magnetic circuit means encircling the conductors of the mains cable and forming a magnetic circuit having a gap, the magnetic flux in the gap being representative of the vector sum of the individual currents in the conductors. Magnetic switch means in magnetic communication with the gap and responsive to the magnetic flux therein produce a control effect upon the magnetic field therein exceeding a predetermined threshold level. Indicator means responsive to the control effect provide an indication of a ground fault in the system.

BRIEF DESCRIPTION OF THE DRAWINGS

The features of the present invention, which are believed to be novel, are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a perspective view, partially broken away, illustrating the ground fault indicator of the invention in conjunction with a multi-phase mains cable of a power distribution system.

FIG. 2 is a cross-sectional view of the ground fault indicator and cable taken along line 2—2 of FIG. 1.

FIG. 3 is a rear perspective view of the magnetic switch module of the ground fault indicator partially broken away to show the magnetic reed switch contained therein.

FIGS. 6a and 6b are diagrammatic views of principal components of the ground fault indicator in a reset state.

FIGS. 7a and 7b are diagrammatic views similar to FIGS. 6a and 6b, respectively, showing the principal components of the ground fault indicator in transition between a reset state and a tripped state.

FIGS. 8a and 8b are diagrammatic views similar to FIGS. 6a and 6b, respectively, showing the principal components of the ground fault indicator in a tripped state.

FIG. 9 is a graphical depiction of certain time, voltage and current relationships within the ground fault indicator circuitry useful in understanding the operation of the ground fault indicator.

DESCRIPTION OF THE PREFERRED EMBODIMENT

Figure 4:
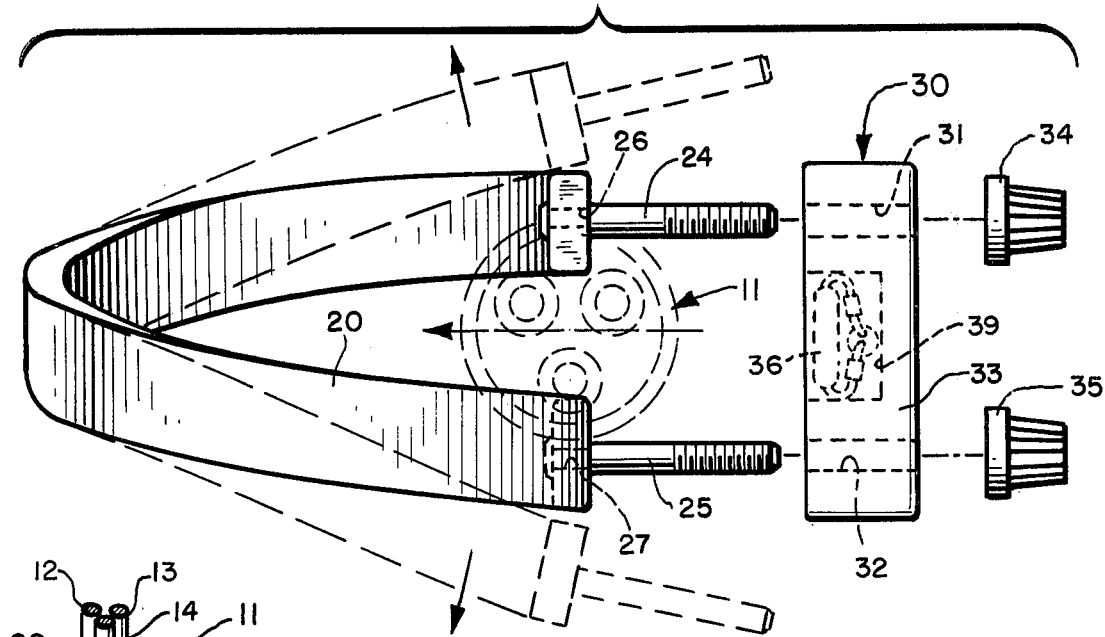
FIG. 4 is a front elevational view of the magnetic pole assembly and magnetic switch module of the ground fault indicator showing the disassembly of the switch module from the magnetic pole assembly and the reformation of the assembly to facilitate installation of the fault indicator on a multi-phase electrical mains cable.

Referring to the drawings, and particularly to FIGS. 1-4, a ground fault indicator 10 constructed in accordance with the invention is shown in conjunction with a conventional three-conductor insulated mains cable 11 of the type commonly used in a multi-phase high voltage alternating current power distribution system. As shown, cable 11 includes three conductors 12, 13 and 14 having individual electrical insulating jackets 15, 16 and 17, respectively. In accordance with conventional practice, the jacketed conductors are embedded in an additional insulating filler 18 and are surrounded by an outer jacket 19. Although a three-conductor three-phase arrangement is shown, it will be appreciated that cable 11 may in certain applications include a fourth conductor for providing a ground return path, and that the invention is applicable to this arrangement as well.

To detect the occurrence of a fault current in the three-phase system of mains cable 11, ground fault indicator 10 includes magnetic flux sensing means in the form of a split-core flexible magnetic pole assembly 20 arranged around the three conductors of cable 11 as a helix having axially-spaced end portions 21 and 22. As shown in FIG. 2, the magnetic pole assembly 20 is preferably formed from a plurality of individual strips 23 of magnetically conductive spring steel, or the like, arranged in laminate form one beside the other so as to maintain a high degree of flexibility. The individual strips 23 are bonded together at ends 21 and 22 by means of retaining studs 24 and 25 which extend through respective appropriately dimensioned apertures 26 and 27 in the ends of the strips. A layer 28 of an electrically-insulating sealant material such as rubber may be provided over strips 23 to protect the assembled strips from exposure to moisture, and to prevent the strips from possibly electrically shorting exposed conductors in the monitored system.

The effect of the helical magnetic pole structure provided by pole assembly 20 is to provide at ends 21 and 22 a magnetic flux comprising the vector sum of the individual fluxes generated by current flow through conductors 12, 13 and 14. This summation flux is monitored by means of a magnetic flux monitoring module 30 which is mounted to the ends of the magnetic pole assembly so as to bridge the gap G (FIG. 2) formed between the spaced-apart ends of the pole assembly by means of studs 24 and 25, which extend through respective apertures 31 and 32 in the housing 33 of the module. A pair of knurled retaining caps 34 and 35 are threaded over the projecting ends of studs 24 and 25 to retain module 30 securely in position.

Within a recess 39 in housing 33, the ground fault indicator includes a magnetic switching element in the form of a reed switch 36 having an elongated hermetically sealed body of conventional construction from which electrical leads 37 and 38 axially extend. Switch 36 is positioned within recess 39 with its axis parallel to the axis of conductors 12, 13 and 14, and in close proximity to gap G. When the reed switch has been properly positioned, recess 39 is filled with a non-conductive filler material 40 (FIG. 3) such as epoxy to maintain the reed switch securely in position.

Electrical connection is made to leads 37 and 38 of reed switch 36 by means of a two-conductor cable 41 having individual electrical conductors 42 and 43 connected to leads 37 and 38 at connection sites 44 and 45, respectively. Cable 41 extends to recess 39 through an appropriately dimensioned aperture in housing 33.

Referring to FIG. 1, ground fault indicator 10 also includes a remotely-mounted indicator module 50 within which indicator means visible to an operator or lineman are provided for indicating the ground fault status of the monitored system. Also contained within indicator module 50 is circuitry for driving the indicator to an appropriate position. This circuitry is powered by an external current source, such as the secondary winding of a distribution transformer, by means of a single-conductor cable 51 having a connecting lug 52 of appropriate form and dimensions for connection to the source. The indicator module 50 may be conveniently mounted at a remote location by means of an electrically conductive flange 53 having apertures 54 through which appropriate mounting hardware can be installed. The electrical components of the fault indicator are contained within a cylindrical transparent plastic housing 55, which includes an integral partition 56 which serves as a mask and spacing element, and a transparent end cap portion 57 sonically welded to the end of the housing through which the internal indicating element of the indicator module can be viewed through a window 58.

Referring to FIG. 1, a disc-shaped circuit board 60 is positioned perpendicularly to the axis of the housing. This circuit board, which may be secured in position by an epoxy material 61 filling the rear portion of the housing, serves as mounting means for the electrical components of the fault indicator circuitry. An electrical connection is established between this circuitry and the external alternating current excitation source by means of a single conductor 63 which extends from the circuit board at one end, and continues within cable 51 externally to the housing. An electrical ground connection is established to the circuit board by means of an additional electrical conductor 64 which extends from the circuit board to an electrically-conductor rivet 62 between the housing and the electrically grounded mounting flange 53.

To provide an indication of the occurrence of a ground fault current through cable 11, the ground fault indicator includes within the lower end of housing 55 a disc-shaped target 65 mounted for rotation on a pivot point 66. As seen in FIGS. 6-8, the face of target disc 65 has a red segment 65a and a white segment 65b, only one of which is visible at a time through a window 58 in the transparent end of housing 55.

Secured to and pivotal with target disc 65 is a target permanent magnet 70, which is formed of a magnetic material having a high coercive force, such as ceramic, and is magnetically polarized to form two magnetic poles of opposite gender, as indicated in FIGS. 6-8, with opposite magnetic polarities along a diameter of the magnet. The target disc 65 and its permanent magnet 70 are biased to the position shown in FIGS. 6a and 6b when the fault indicator is in a non-tripped or reset condition by means of a stationary generally U-shaped magnetic pole piece 71 which is mounted within housing 55 on circuit board 60 generally co-planar with the axis of rotation of the target disc.

Pole piece 71, which is preferably formed of a magnetic material having a relatively low coercive force, such as a chrome steel, in the reset mode is biased at its projecting ends to the magnetic polarities indicated in FIGS. 6a and 6b. As shown in FIG. 1, the ends of the pole piece extend along the side wall of housing 55, in close proximity to target 70. As a result, the opposite polarity magnetic poles of the target magnet 70 are attracted to position the target disc 65 as shown. In this position the red segment 65a of the target disc is not visible through window 58, and all that is seen is the white segment 65b.

On the occurrence of a ground fault current in cable 11, reed switch 36 closes and pole piece 71 is remagnetized to the magnetic polarities shown in FIGS. 7 and 8 by momentary energization of a trip winding 72 on the center section of the pole piece. As a result, the poles of magnet 70 are repelled by the adjacent like-gender poles of the pole piece and target disc 65 is caused to rotate 180° to the tripped position shown in FIGS. 8a and 8b. In this position, the red segment 65 of the target disc is visible through window 58, and a lineman viewing the fault indicator is advised that a ground fault current has flowed through cable 11.

The target disc remains in the fault indicating position until the ends of pole piece 71 are subsequently re-magnetized to the magnetic polarities shown in FIGS. 6a and 6b by momentary energization of a reset winding 73 on the center section of the pole piece. As a result, the target magnet 70, and hence the target disc 65, is caused to rotate from the tripped position shown in FIGS. 8a and 8b to the reset position shown in FIGS. 6a and 6b, and the fault indicator is conditioned to respond to a subsequent fault current.

Figure 5:
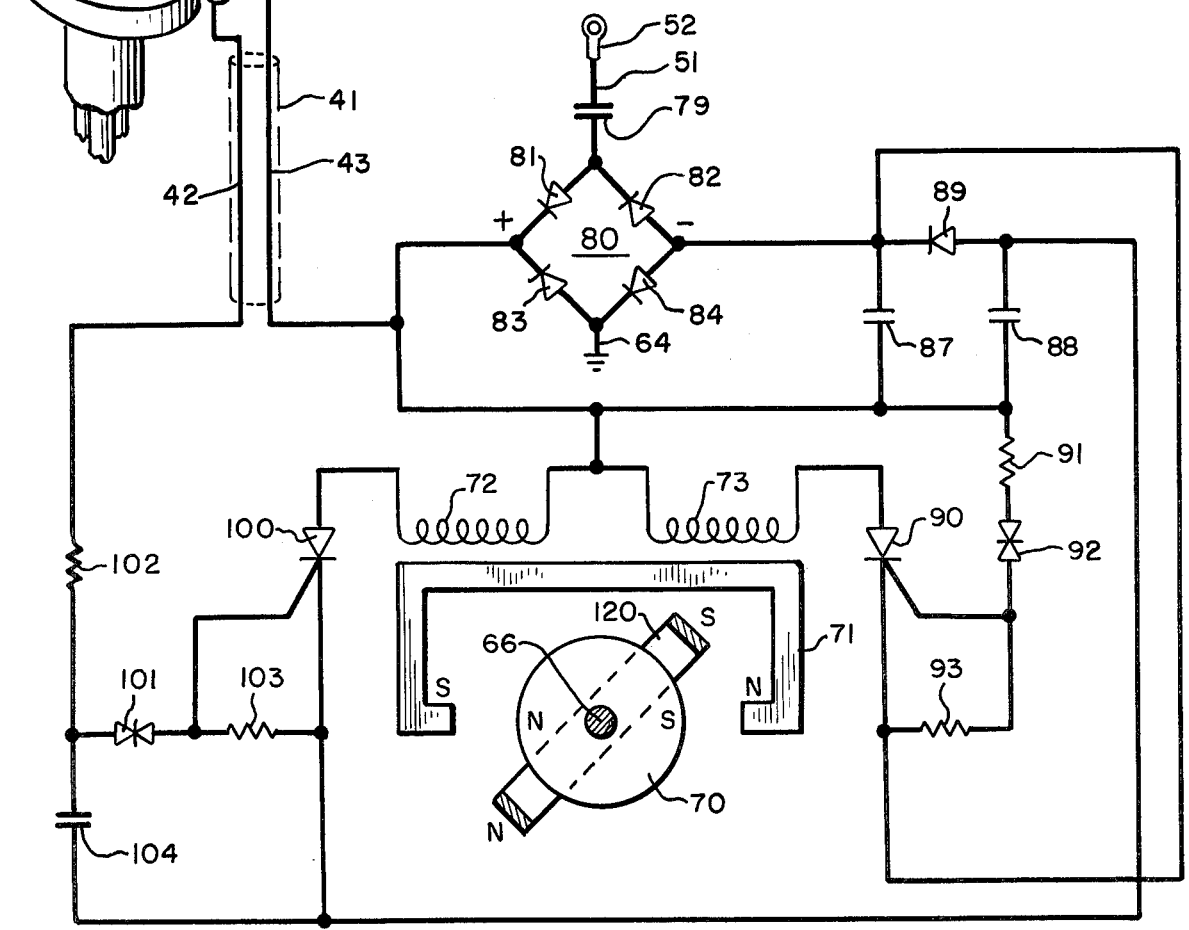
FIG. 5 is an electrical schematic diagram of the ground fault indicator.

Energization of winding 72 upon occurrence of a ground fault current in cable 11, and energization of winding 73 upon subsequent clearing of the ground fault, is accomplished by means of externally powered circuitry contained within the fault indicator. Referring to the schematic diagram shown in FIG. 5, windings 72 and 73 are connected end-to-end for independent energization upon occurrence of fault and reset conditions, respectively. Operating power for these windings is obtained by means of a bridge rectifier network 80, consisting of diodes 81-84. One input terminal of this network, formed at the juncture of the anode of diode 81 and the cathode of diode 82, is connected through a capacitor 79 and cable 51 to an external source of excitation. The other input terminal, formed at the anode of diode 83 and the cathode of diode 84, is connected to ground through conductor 64 and the flange 53 of the fault indicator. With this arrangement, alternating current is capacitively coupled to the bridge rectifier network, resulting in the production of a pulsating unidirectional current at the output terminals of the network.

The positive polarity output terminal of the bridge rectifier network, formed at the cathodes of diodes 81 and 83, is connected through conductor 43 of cable 41 to one contact of reed switch 36, to the end terminals of windings 72 and 73, and to respective terminals of conductors 87 and 88. The negative polarity output terminal of the bridge rectifier network, formed at the juncture of the anodes of diodes 82 and 84, is connected directly to the remaining terminal of capacitor 87, and through a forward-biased diode 89 to the remaining terminal of capacitor 88. With this arrangement, capacitors 87 and 88 are charged by the pulsating unidirectional current developed by bridge rectifier network 80 during normal current flow in cable 11.

To provide for periodic energization of reset winding 73 during normal current flow-in cable 11, the remaining end terminal of winding 73 is connected through a silicon controlled rectifier (SCR) 90 to the negative polarity terminal of capacitor 87. Periodic conduction through SCR 90 is obtained by connecting the gate electrode of that device of the positive polarity output terminal of bridge rectifier network 80 through a resistor 91 and a bilateral diode 92, and to the cathode of SCR 90 by a resistor 93. With this arrangement, SCR 90 is periodically triggered into conduction when the voltage developed across bilateral diode 92 as a result of capacitor 87 being charged by bridge rectifier 80 reaches the threshold level of the bilateral diode.

In operation, under normal current flow conditions, the voltage developed across capacitor 87 as the capacitor is charged by bridge rectifier network 80 progressively increases with time, until the threshold breakdown voltage of bilateral diode 92 is reached, at which time SCR 90 is triggered and capacitor 87 discharged through winding 73. Diode 89 prevents capacitor 88 from being discharged through SCR 90 and winding 73, leaving that capacitor available for energizing winding 72 in response to a fault condition.

Trip winding 72 is energized upon occurrence of a ground fault current in cable 11 by discharge of capacitor 88 through a second silicon controlled rectifier (SCR) 100. Conduction is established through SCR 100 by closure of the contacts 85 of reed switch 36, which is positioned within housing 55 in close proximity to the ends of pole piece 20 such that the vector sum alternating magnetic field produced in the pole piece by cable 11 upon occurrence of a ground fault current is sufficient to close the contacts of the reed switch. The gate electrode of SCR 100 is connected through a bilateral diode 101 and a rectifier 102 to the remaining contact of reed switch 86, and by a resistor 103 to the SCR cathode. The juncture of resistor 102 and bilateral diode 101 is connected by a capacitor 104 to capacitor 88.

Upon occurrence of a ground fault current in cable 11, the positive polarity output terminal of bridge rectifier network 80 is connected through the closed contacts of reed switch 36 and the circuit comprising resistor 102, bilateral diode 101, resistor 103 and capacitor 104 to the gate electrode of SCR 100, causing that device to be rendered conductive following a predetermined time delay. At this time capacitor 87 and 88 are caused to discharge through SCR 100 and energize winding 72. The resulting magnetic flux in the U-shaped pole piece 71 reverses the magnetic pole polarities of the pole piece and causes rotation of the target as previously described.

To preclude the possibility of windings 72 and 73 being simultaneously actuated by simultaneous conduction through SCR 100 and SCR 90, the fault indicator includes provision for introducing a predetermined time delay in conduction through SCR 100 following occurrence of a ground fault current in cable 11. This is accomplished by resistor 102 and capacitor 104, which together form an RC time constant circuit in the gate circuit of SCR 100. As a result of this circuit, upon closure of the contacts of reed switch 86 it is necessary that capacitor 104 charge through resistor 102 to the threshold voltage of bilateral diode 101 before sufficient gate electrode current is supplied to SCR 100 to initiate conduction in that device.

The actual time delay provided is determined by the resistance of resistor 102, the capacitance of capacitor 104, the threshold voltage of bilateral diode 101, and the voltage level developed across capacitor 88, and is designed to insure that should a fault occur simultaneously with the periodic energization of winding 73, capacitor 87 will have completely discharged through that winding prior to winding 72 being energized to signal the fault.

The time delay relationship can be seen referring to the waveforms illustrated in FIG. 9. Under normal line current conditions it is seen that the voltage Vc developed across capacitor 87 and depicted by waveform 110 progressively increases until the threshold level of bilateral diode 92 is reached, at which time SCR 90 is rendered conductive and a reset current depicted by waveform 111 is repetitively caused to flow through reset winding 73.

Upon occurrence of a ground fault current in cable 11, as depicted by waveform 112, trip winding 72 is energized after a delay interval t, as shown by waveform 114. Should the fault current occur simultaneously with a reset pulse, as shown by waveform 115, capacitor 87 will have completely discharged through winding 73 prior to winding 72 being energized as a result of the time delay period t. If it were not for this delay period, windings 72 and 73 would be simultaneously energized, resulting in the production of opposing magnetic fields in pole piece 71 and raising the possibility of rotor 65 not responding to the fault.

Should a ground fault occur before the reset pulse, as illustrated by waveform 116, the then occurring reset cycle will be interrupted by discharge of capacitor 87 through diode 89 and SCR 100 so that no possibility exists of a reset pulse occurring simultaneously with the ensuing delayed reset pulse. Upon discharge of capacitors 87 and 88 through winding 72, the reset cycle begins anew as SCR 100 again becomes non-conductive.

To avoid any possibility of rotor 65 becoming stalled upon reversal of the magnetic polarities of pole piece 71, as might happen with a rotor being perfectly centered between the poles of pole pieces 71 and having a degree of bearing friction, the fault indicator includes an auxiliary U-shaped pole piece 120 positioned adjacent target magnet 70 coaxial with and at an angle to pole piece 71. The existence of a magnetic field between the poles of pole piece 71 results in the production of induced magnetic poles on auxiliary pole piece 120 of opposite gender to the most adjacent poles of pole piece 71. As a result, upon reversal of the gender of the poles of pole piece 71 following occurrence of a fault current the auxiliary poles exert a rotational force on the most adjacent poles of the permanent rotor magnet 70 associated with target 65. This causes a rotational moment to be exerted on the target, tending to turn the target in a predetermined (counter-clockwise in FIGS. 6–8) direction such that the target is precluded from remaining in its reset position, even if it should be perfectly positioned and have a degree of bearing friction. Once rotation has been established, as shown in FIGS. 7a and 7b, the greater force of the main pole piece 71 overcomes the effect of the auxiliary pole piece 120 and rotation continues until the target is aligned as shown in FIGS. 8a and 8b.

A further advantage of ground fault indicator 10 is that it can be readily installed and removed from an existing multi-phase mains cable without disconnecting the cable. This is illustrated in FIG. 4, where it is seen that by removing module 30 from pole assembly 20 and spreading apart the ends 21 and 22 of the pole assembly, the pole assembly can be inserted directly over a cable. Once the pole assembly is in place, the magnetic sensing module 30 can be readily reinstalled by directing mounting studs 24 and 25 through apertures 31 and 32, and then threading retaining caps 34 and 35 on the ends of the studs.

Once module 30 has been installed, it should be noted that the axis of reed switch 36 lies parallel to the axis of conductors 12, 13 and 14. For reasons well known to the art, this alignment minimizes the direct effect of the magnetic field from any one conductor on the reed switch, thereby rendering the switch relatively immune to the current level in any one conductor. This allows the reed switch to be made more sensitive to ground fault currents since the normal higher phase currents in the individual phase conductors will not trip the reed switch, even when they exceed the threshold level of the switch.

It will be appreciated that other types of magnetic sensors may be used in place of reed switch 36, and that the indicator module 50 may employ totally electronic means responsive to module 30 for indicating circuit status with respect to ground faults. Furthermore, in appropriate applications, indicator module 50 may be combined with flux detector module 30, the combined unit being mounted to studs 24 and 25.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A ground fault indicator for indicating the occurrence of a ground fault current in multi-conductor electrical mains, comprising, in combination:
   magnetic circuit means comprising a helical magnetic pole piece having axially displaced ends encircling the conductors of the mains and forming a magnetic field between said axially displaced ends substantially parallel to the axis of said conductors dependent on the vector sum of the individual currents in the conductors;
   magnetic sensing means disposed between said axially displaced ends and producing a control effect in response to said magnetic field exceeding a predetermined threshold level;
   status indicating means having a reset-indicating state and a fault-indicating state; and
   circuit means for conditioning said status indicating means to said fault-indicating state in response to said control effect.

2. A ground fault indicator as defined in claim 1 wherein said magnetic pole piece comprises a magnetically conductive single turn helical core.

3. A ground fault indicator as defined in claim 2 wherein said core comprises a plurality of magnetically-conductive resilient lamination elements.

4. A ground fault indicator as defined in claim 1 comprising first and second housings, said sensing means being contained in said first housing, said status indicating means and said circuit means being contained in said second housing remote from said first housing, and cable means for connecting said sensing means to said circuit means.

5. A ground fault indicator as defined in claim 1 wherein said magnetic sensing means include a magnetic reed switch positioned between said axially displaced ends.

6. A ground fault indicator as defined in claim 5 wherein the contacts of said reed switch are aligned generally parallel to the axis of the conductors to render said switch means substantially non-responsive to the magnetic field produced by current in any one conductor of the cable.

7. A ground fault indicator for indicating the occurrence of a ground fault current in multi-conductor electrical mains, comprising, in combination:
magnetic circuit means comprising a single turn helical-shaped magnetic pole piece having axiallly displaced ends encircling the conductors of the mains and having a gap between said axially displaced ends, the magnetic flux in said gap corresponding to the vector sum of the individual currents in the conductors said magnetic pole piece being positioned so that the magnetic field in said gap is aligned generally parallel with the axis of the conductors;
magnetic switch means in magnetic communication with said gap and responsive to the magnetic flux within said gap for producing a control effect upon said flux exceeding a predetermined threshold level;
status indicating means having a reset-indicating state and a fault-indicating state; and
circuit means for conditioning said status indicating means to said fault indicating state in response to said ground fault current exceeding the predetermined threshold level.

8. A ground fault indicator as defined in claim 7 wherein said magnetic switch means comprise a reed switch having contacts generally aligned parallel to the axis of the conductors.

9. A ground fault indicator as defined in claim 7 wherein said sensing means are responsive to an applied magnetic field along a predetermined axis, and wherein said predetermined axis is generally aligned parallel with the axis of the conductors.

10. A ground fault indicator as defined in claim 7 comprising first and second housings, said switch means being contained in said first housing, said status indicating means and said circuit means being contained in said second housing remote from said first housing, and cable means for connecting said switch means to said circuit means.

11. A ground fault indicator as defined in claim 7 wherein said helical magnetic pole piece is resilient and deformable to facilitate installation over connected mains.

12. A ground fault indicator for indicating the occurrence of a ground fault current in multi-conductor electrical mains, commprising, in combination:
first and seconnd housings;
magnetic circuit means comprising a single turn helical-shaped magnetic pole piece encircling the conductors of the mains and having axially displaced ends forming a gap therein, the magnetic flux in said gap corresponding to the vector sum of the individual currents in the conductors, said magnetic pole piece positioned so that the magnetic field within said gap is aligned generally parallel with the axis of the conductors;
magnetic switch means within said first housing in magnetic communication with said gap and responsive to the magnetic flux therein for producing a control effect upon said flux exceeding a predetermined threshold level;
status indicating means in said second housing remote from said first housing and viewable from the exterior of said second housing and having a reset-indicating state and a fault-indicating state;
circuit means for conditioning said status indicating means to said fault indicating state in response to said ground fault current exceeding the predetermined threshold level; and
means comprising a flexible cable extending between said first and second housings for connecting said magnetic switch means to said circuit means.

13. A ground fault indicator as defined in claim 12 wherein said magnetic sensing comprise a reed switch having contacts generally aligned parallel with the axis of said conductors.

14. A ground fault indicator as defined in claim 12 wherein said sensing means are responsive to an applied magnetic field along a predetermined axis, and wherein said predetermined axis is generally aligned parallel with the axis of the conductors.

15. A ground fault indicator as defined in claim 1 wherein said sensing means are responsive to an applied magnetic field along a predetermined axis, and wherein said predetermined axis is generally aligned parallel with the axis of the conductors.

* * * * *